(12) United States Patent
Huang et al.

(10) Patent No.: US 9,219,239 B2
(45) Date of Patent: *Dec. 22, 2015

(54) PHOTOVOLTAIC DEVICE

(71) Applicant: NUtech Ventures, Lincoln, NE (US)

(72) Inventors: Jinsong Huang, Lincoln, NE (US); Bin Yang, Lincoln, NE (US); Yongbo Yuan, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/263,571

(22) Filed: Apr. 28, 2014

(65) Prior Publication Data

US 2015/0107672 A1    Apr. 23, 2015

Related U.S. Application Data

(63) Continuation of application No. 13/707,091, filed on Dec. 6, 2012, now Pat. No. 8,796,677.

(60) Provisional application No. 61/567,200, filed on Dec. 6, 2011.

(51) Int. Cl.
*H01L 51/44* (2006.01)
*H01L 51/46* (2006.01)
*H01L 51/42* (2006.01)
*H01L 51/00* (2006.01)

(52) U.S. Cl.
CPC ............ *H01L 51/4293* (2013.01); *H01L 51/44* (2013.01); *H01L 51/445* (2013.01); *H01L 51/0036* (2013.01); *H01L 51/0037* (2013.01); *H01L 51/0046* (2013.01); *H01L 2251/308* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 8,796,677 B2 * | 8/2014 | Huang et al. | 257/40 |
| 2006/0174937 A1 | 8/2006 | Zhou | |
| 2007/0119496 A1 | 5/2007 | Baldo et al. | |
| 2011/0031481 A1 | 2/2011 | Von Wrochem et al. | |
| 2011/0308592 A1 | 12/2011 | Konemann et al. | |
| 2012/0068269 A1 | 3/2012 | Lin | |
| 2012/0085412 A1 | 4/2012 | Lee et al. | |
| 2012/0118368 A1 | 5/2012 | Huang et al. | |
| 2013/0199601 A1 | 8/2013 | Vardney et al. | |
| 2013/0230942 A1 | 9/2013 | Nalwa et al. | |

OTHER PUBLICATIONS

Asadi, Kamal, Paul De Bruyn, Paul W. M. Blom, and Dago M. De Leeuw. "Origin of the Efficiency Enhancement in Ferroelectric Functionalized Organic Solar Cells." Applied Physics Letters 98.18 (2011): 183301.*

Yuan, Yongbo, Timothy J. Reece, Pankaj Sharma, Shashi Poddar, Stephen Ducharme, Alexei Gruverman, Yang Yang and Jinsong Huang. "Efficiency Enhancement in Organic Solar Cells with Ferroelectric Polymers." Nature Materials (2011).*

(Continued)

*Primary Examiner* — Joseph Schoenholtz
(74) *Attorney, Agent, or Firm* — Fish & Richardson P.C.

(57) ABSTRACT

An apparatus includes a substrate; and a photoactive layer disposed on the substrate. The photoactive layer includes an electron acceptor material; an electron donor material; and a material having dipoles.

35 Claims, 12 Drawing Sheets

(56) References Cited

OTHER PUBLICATIONS

Asadi, Kamal, Paul De Bruyn, Paul W. M. Blom, and Dago M. De Leeuw. "Origin of the Efficiency Enhancement in Ferroelectric Functionalized Organic Solar Cells." Appl. Phys. Lett. Applied Physics Letters 98.18 (2011): 183301.*

Goh, Chiatzun, Shawn R. Scully, and Michael D. Mcgehee. "Effects of Molecular Interface Modification in Hybrid Organic-inorganic Photovoltaic Cells." J. Appl. Phys. Journal of Applied Physics 101.11 (2007): 114503.*

Yang, Bin, Yongbo Yuan, Pankaj Sharma, Shashi Poddar, Rafal Korlacki, Stephen Ducharme, Alexei Gruverman, Ravi Saraf, and Jinsong Huang. "Tuning the Energy Level Offset between Donor and Acceptor with Ferroelectric Dipole Layers for Increased Efficiency in Bilayer Organic Photovoltaic Cells." Adv. Mater. Advanced Materials 24.11 (2012): 1455-460.*

Tada, Akira, Yanfang Geng, Qingshuo Wei, Kazuhito Hashimoto, and Keisuke Tajima. "Tailoring Organic Heterojunction Interfaces in Bilayer Polymer Photovoltaic Devices." Nature Materials Nat Mater 10.6 (2011): 450-55.*

Zhong, Yufei, Jusha Ma, Kazuhito Hashimoto, and Keisuke Tajima. "Electric Field-Induced Dipole Switching at the Donor/Acceptor Interface in Organic Solar Cells." Adv. Mater. Advanced Materials 25.7 (2012): 1071-075.*

Huang, Jiang, Junsheng Yu, Yige Qi, and Yadong Jiang. "Improvement in Open-Circuit Voltage for Organic Solar Cells Based on Subphthalocyanines and C60." Energy Procedia 12 (2011): 508-12.*

Amb et al., "Dithienogermole As a Fused Electron Donor in Bulk Heterojunction Solar Cells," *J. Am. Chem.Soc.*, 2011, 133:10062-10065.

Asadi et al., "Origin of the efficiency enhancement in ferroelectric functionalized organic solar cells," *Appl. Phys. Lett.*, 2011, 98:183301, 4 pages.

Brabec et al., "Origin of the Open Circuit Voltage of Plastic Solar Cells," 11(5):374-380 *Adv. Funct. Mater.*, 2001, 11(5):374-380.

Bune et al., "Piezoelectric and pyroelectric properties of ferroelectric Langmuir—Blodgett polymer films," *Appl. Phys.*, 1999, 85:7869-7873.

Bune et al., "Two-dimensional ferroelectric films," *Nature*, 1998, 391:874-877.

Chen et al., "Polymer solar cells with enhanced open-circuit voltage and efficiency," *Nat. Photonics*, 2009, 3:649-653.

Cheng et al., "Combination of Indene-C60 Bis-Adduct and Cross-Linked Fullerene Interlayer Leading to Highly Efficient Inverted Polymer Solar Cells," *J. Am. Chem. Soc.*, 2010, 132:17381-17383.

Cook et al., "Ultrafast Studies of Charge Generation in PCBM:P3HT Blend Films following Excitation of the Fullerene PCBM," *J. Phys. Chem. C* 2009, 113:2547-2552.

Elwin and Thompson, "Elucidating the interplay between dark current coupling and open circuit voltage in organic photovoltaics," *Appl. Phys. Lett.*, 2011, 98:223305, 4 pages.

Fridkin et al., "Switching in One Monolayer of the Ferroelectric Polymer," *Ferroelectrics*, 2005, 314:37-40.

Gevaelts et al., "Discriminating between Bilayer and Bulk Heterojunction Polymer: Fullerene Solar Cells Using the External Quantum Efficiency," *ACS Appl. Mater. Interfaces*, 2011, 3:3252-3255.

Giebink et al., "Thermodynamic efficiency limit of excitonic solar cells," *Phys. Rev. B*, 2011, 83:195326.

Gong et al., "Bulk Heterojunction Solar Cells with Large Open-Circuit Voltage: Electron Transfer with Small Donor-Acceptor Energy Offset," *Adv. Mater.*, 2011, 23:2272-2277.

Gruverman, "Nanoscale insight into the statics and dynamics of polarization behavior in thin film ferroelectric capacitors," *J. Mater. Sci.*, 2009, 44:5182-5188.

He et al., "Simultaneous Enhancement of Open-Circuit Voltage, Short-Circuit Current Density, and Fill Factor in Polymer Solar Cells," *Adv. Mater.*, 2011, 23:4636.

Khlyabich et al., "Efficient Ternary Blend Bulk Heterojunction Solar Cells with Tunable Open-Circuit Voltage," *Am. Chem. Soc.*, 2011, 133:14534-14537.

Kirchartz et al., "Efficiency Limits of Organic Bulk Heterojunction Solar Cells," *J. Phys. Chem. C*, 2009, 113:17958-17966.

Lee et al., "Morphology of All-Solution-Processed "Bilayer" Organic Solar Cells," *Adv. Mater.*, 2011, 23:766-770.

Li et al., "Open circuit voltage enhancement due to reduced dark current in small molecule photovoltaic cells," *Appl. Phys. Lett.*, 2009, 94:023307.

Li et al., "High-efficiency solution processable polymer photovoltaic cells by self-organization of polymer blends," *Nat. Mater.*, 2005, 4:864-868.

Liang et al., "For the Bright Future—Bulk Heterojunction Polymer Solar Cells with Power Conversion Efficiency of 7.4%," *Adv. Mater.*, 2010, 22:E135-E138.

Loser et al., "A Naphthodithiophene-Diketopyrrolopyrrole Donor Molecule for Efficient Solution-Processed Solar Cells," *J. Am. Chem. Soc.*, 2011, 133:8142-8145.

Marcus, "Electron transfer reactions in chemistry. Theory and experiment," *Rev. Mod. Phys.*, 1993, 65:599-610.

Nalwa et al., "Enhanced Charged Separation in Organic Photovoltaic Films Doped with Ferroelectric Dipolse," *Energy Environ. Sci.*, 2012, 5:7042-7049.

Park et al., "Bulk heterojunction solar cells with internal quantum efficiency approaching 100%," *Nat. Photonics*, 2009, 3:297-302.

Potscavage et al., "Origin of the open-circuit voltage in multilayer heterojunction organic solar cells," *Appl. Phys. Lett.*, 2008, 93:193308, 4 pages.

Price et al., "Fluorine Substituted Conjugated Polymer of Medium Band Gap Yields 7% Efficiency in Polymer—Fullerene Solar Cells," *J. Am. Chem. Soc.*, 2011, 133:4625-4631.

Scharber et al., "Design Rules for Donors in Bulk-Heterojunction Solar Cells—Towards 10 % Energy-Conversion Efficiency," *Adv. Mater.*, 2006, 18:789-794.

Sharma et al., "High-Resolution Studies of Domain Switching Behavior in Nanostructured Ferroelectric Polymers," *Nano Lett.*, 2011, 11:1970-1975.

Vandewal et al., "Charge-Transfer States and Upper Limit of the Open-Circuit Voltage in Polymer: Fullerene Organic Solar Cells," *IEEE J. Sel. Top. Quantum Electron.*, 2010, 16:1676.

Vandewal et al., "On the origin of the open-circuit voltage of polymer—fullerene solar cells," *Nat. Mater.*, 2009, 8:904-909.

Vikas et al., "Selection of metal substrates for completely solution-processed inverted organic photovoltaic devices," *Solar Energy Materials and Solar Cells*, 2013, 113:179-185.

Voroshazi et al., "Novel bis-$C_{60}$ derivative compared to other fullerene bis-adducts in high efficiency polymer photovoltaic cells," *J. Mater. Chem.*, 2011, 21:17345-17352.

Yang et al., "Increased efficiency of low band gap polymer solar cells at elevated temperature and its origins," *Appl. Phys. Lett.*, 2011, 99:133302.

Yip et al., "Polymer Solar Cells that Use Self-Assembled-Monolayer-Modified ZnO/Metals as Cathodes," *Advanced Materials*, 2008, 20(12):2376-382.

Yuan et al., "Efficiency enhancement in organic solar cells with ferroelectric polymers," *Nat. Mater.*, 2011, 10:296-302.

Zhao et al., "6.5% Efficiency of Polymer Solar Cells Based on poly(3-hexylthiophene) and Indene-C60 Bisadduct by Device Optimization," *Adv. Mater.*, 2010, 22:4355.

Zimmermann et al., "Long term stability of efficient inverted P3HT:PCBM solar cells," *Solar Energy Materials and Solar Cells*, 93(4):491-496.

* cited by examiner

| Devices | | $J_{sc}$ (mA/cm²) | $V_{OC}$ (V) | PCE (%) | FF (%) |
|---|---|---|---|---|---|
| without PVDF | | 8.65 | 0.868 | 3.3 | 44 |
| With PVDF | before poling | 9.08 | 0.850 | 3.5 | 45 |
| | after poling | 8.92 | 0.875 | 3.7 | 47 |

PHOTOVOLTAIC DEVICE

CROSS-REFERENCE TO RELATED APPLICATIONS

This application is a continuation of and claims priority to U.S. patent application Ser. No. 13/707,091, filed on Dec. 6, 2012, which claims priority under 35 USC §119(e) to U.S. Patent Application Ser. No. 61/567,200, filed on Dec. 6, 2011. The entire contents of the above applications are hereby incorporated by reference.

STATEMENT AS TO FEDERALLY SPONSORED RESEARCH

This invention was made with government support under contract HDTRA1-10-1-0098 awarded by the Defense Threat Reduction Agency and under contract DMR-0820521 awarded by the NSF MRSEC Program. The government has certain rights in the invention.

BACKGROUND

Organic photovoltaic devices are attractive candidates for energy applications because of their light weight, flexibility, low cost, and compatibility with large scale production. The thermodynamic efficiency limit of organic photovoltaic devices is about 22-27%, which meets or exceeds the efficiency of silicon solar cells and other thin film photovoltaic technologies.

SUMMARY

An organic semiconductor photovoltaic device having an enhanced power conversion efficiency includes a photoactive layer. The photoactive layer includes a donor layer and an acceptor layer, each formed of an organic semiconductor. A dipole layer is disposed between the donor layer and the acceptor layer. The dipole layer is polarizable under an applied electric field and causes the energy levels of the donor layer, the acceptor layer, or both, to shift. This shift in energy levels increases the open circuit voltage across the photovoltaic device, resulting in an improved power conversion efficiency of the device.

In a general aspect, an apparatus includes a substrate; and a photoactive layer disposed on the substrate. The photoactive layer includes an electron acceptor material; an electron donor material; and a material having dipoles.

Embodiments may include one or more of the following.

The photoactive layer includes an acceptor layer formed of the electron acceptor material; a donor layer formed of the electron donor material; and a dipole layer formed of the material having dipoles and disposed between the acceptor layer and the donor layer. In some cases, the dipole layer is less than 1 nm thick. In some cases, the dipole layer is a monomolecular layer.

The photoactive layer is a single layer that includes the electron acceptor material, the electron donor material, and the polarizable material.

The electron acceptor material includes fullerenes.

The dipoles align upon application of a bias electric field.

The material having dipoles has a polarization charge density of at least about 5 $mC/m^2$.

The material having dipoles is configured to cause a shift in an energy level of at least one of the electron acceptor material and the electron donor material. In some cases, the dipoles reduce an offset between the lowest unoccupied molecular orbits of the electron acceptor material and the electron donor material.

The material having dipoles includes a ferroelectric polymer. In some cases, the material having dipoles includes polyvinylidene fluoride and tetrafluoroethylene.

The material having dipoles includes liquid crystal molecules.

At least one of the electron acceptor material and the electron donor material includes an organic semiconductor material.

In a general aspect, an apparatus includes an electrically conductive substrate; and a photoactive layer disposed on the substrate. The photoactive layer includes an electron acceptor material; an electron donor material; and a material having dipoles; and an electrical contact disposed on the photoactive layer.

Embodiments may include one or more of the following.

The photoactive layer includes an acceptor layer formed of the electron acceptor material; a donor layer formed of the electron donor material; and a dipole layer formed of the material having dipoles and disposed between the acceptor layer and the donor layer.

The photoactive layer is a single layer that includes the electron acceptor material, the electron donor material, and the material having dipoles.

The material having dipoles is configured to increase an open circuit voltage between the substrate and the electrical contact.

The material having dipoles is configured to cause a shift in an energy level of at least one of the electron acceptor material and the electron donor material The dipoles align upon application of a bias to the polarizable material.

The substrate is transparent.

At least one of the electron acceptor material and the electron donor material comprises an organic semiconductor material.

In a general aspect, a method includes forming a photoactive layer on an electrically conductive substrate. The photoactive layer includes an electron acceptor material; an electron donor material; and a material having dipoles. The method further includes forming an electrical contact on the photoactive layer; and applying an electrical bias to the material having dipoles.

Embodiments may include one or more of the following.

Forming the photoactive layer includes forming an acceptor layer including the electron acceptor material; forming a donor layer including the electron donor material; and forming a dipole layer including the material having dipoles between the acceptor layer and the donor layer.

Forming the photoactive layer comprises forming a single layer that includes the electron acceptor material, the electron donor material, and the material having dipoles.

Applying an electrical bias to the material having dipoles includes causing dipoles to align.

Applying an electrical bias to the material having dipoles includes causing an increase in an open circuit voltage between the substrate and the electrical contact.

At least one of the electron acceptor material and the electron donor material is an organic semiconductor material.

The techniques described herein may have one or more of the following advantages. For instance, the open circuit voltage of an organic photovoltaic device can be increased by inserting a dipole layer that tunes the energy level offset of the donor semiconductor material and the acceptor semiconductor material in the device. This tuning of energy levels can be achieved without altering the chemical structure of the donor and acceptor materials, thus allowing donor and acceptor materials to be selected based on desired characteristics such as stability, band gap, mobility, or other characteristics.

Other features and advantages are apparent from the following description and from the claims.

DETAILED DESCRIPTION

Figure 1:
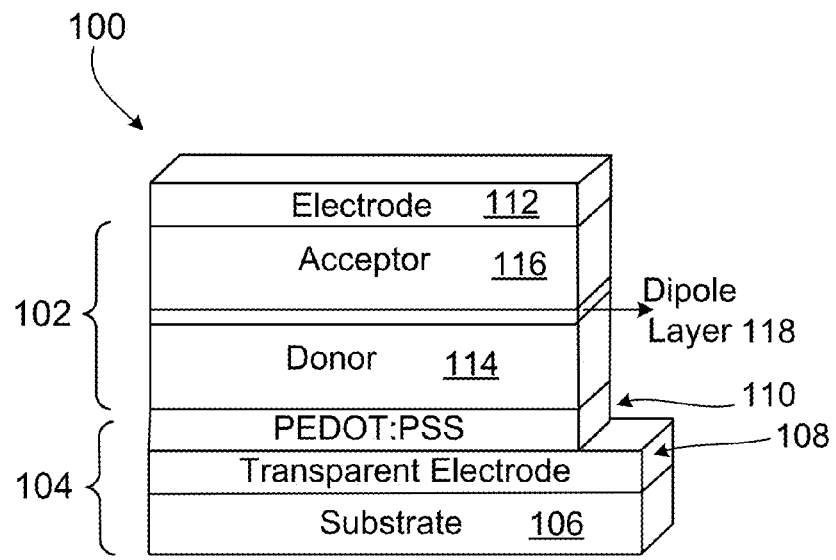
FIG. 1 is a diagram of a photovoltaic device.

Referring to FIG. 1, an organic semiconductor photovoltaic device 100 having an enhanced power conversion efficiency includes a photoactive layer 102. The photoactive layer 102 includes a donor layer 114 and an acceptor layer 116, each formed of an organic semiconductor. The donor layer 114 includes an electron donor material, and the acceptor layer 116 includes an electron acceptor material. A dipole layer 118 is disposed between the donor layer 114 and the acceptor layer 116. The dipole layer 118 is polarizable under an applied electric field and causes the energy levels of the donor layer 114, the acceptor layer 116, or both, to shift. This shift in energy levels increases the open circuit voltage across the photovoltaic device 100, resulting in an improved power conversion efficiency of the device.

The donor layer 114 and the acceptor layer 116 are formed of organic semiconductor materials. In the examples described herein, the donor layer 114 and the acceptor layer 116 are formed of poly(3-hexylthiophene) (P3HT) and [6,6]-phenyl-C61-butyric acid ($PC_{60}BM$, referred to herein as PCBM), respectively. Other organic semiconductor materials may also be used to form the donor layer 114 and the acceptor layer 116, some examples of which are listed below.

The donor layer 114 may be formed of any appropriate p-type organic semiconductor material or combination of materials. For example, the donor layer may be formed of one or more of the following materials: a phthalocyanine complex, a porphyrin complex, a polythiophene (PT) or derivatives thereof, a polycarbazole or derivatives thereof, a poly (p-phenylene vinylene) (PPV) or derivatives thereof, a polyfluorene (PF) or derivatives thereof, a cyclopentadithiophene-based polymer, a benzodithiophene (BDT)-based polymer, and combinations thereof. For instance, polythiophenes and derivatives thereof, polycarbazoles and derivatives thereof, and phthalocyanine complexes can be used to form the donor layer 114. More specifically, the following materials can be used as electron donor materials: subphthalocyanine (SubPC), copper phthalocyanine (CuPc), Zinc phthalocyanine (ZnPc), poly(3-hexylthiophene) (P3HT), poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly {[2,7-(9,9-bis-(2-ethylhexyl)-fluorene)]-alt-[5,5-(4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,1,3-benzothiadiazole)]} (BisDMO-PFDTBT), poly[N-9"-hepta-decanyl-2,7-carbazole-alt-5,5-(4',7'-di-2-thienyl-2',1',3'-benzothiadiazole)] (PCDTBT), poly[4,8-bis-substituted-benzo[1,2-b:4,5-b']dithiophene-2,6-diyl-alt-4-substituted-thieno[3,4-b]thio-phene-2,6-diyl] (PBDTTT-C-T), Poly(benzo[1,2-b:4,5-b']dithiophene-alt-thieno[3,4-c]pyrrole-4,6-dione (PBDTTPD), poly((4,4-dioctyldithieno(3,2-b:2',3'-d)silole)-2,6-diyl-alt-(2,1,3-benzothiadiazole)-4,7-diyl) (PSBTBT), and combinations thereof.

The acceptor layer 116 may be formed of any appropriate n-type organic semiconductor material or combination of materials. For examples, the acceptor layer 116 may be formed of one or more of the following materials: a fullerene or derivatives thereof, a perylene derivative, a 2,7-dicyclohexyl benzo[lmn][3,8]phenanthroline derivative, a 1,4-diketo-3,6-dithienylpyrrolo[3,4-c]pyrrole (DPP) derivative, a tetracyanoquinodimethane (TCNQ) derivative, a poly(p-pyridyl vinylene) (PPyV) derivative, a 9,9'-bifluorenylidene (99BF) derivative, a benzothiadiazole (BT) derivative, and combinations thereof. For instance, fullerenes and derivatives thereof can be used to form the acceptor layer 116. More specifically, the following materials can be used as electron acceptor materials: [6,6]-phenyl-C61-butyric acid ($PC_{60}BM$, referred to herein as PCBM), [6,6]-(4-fluoro-phenyl)-$C_{61}$-butyric acid methyl ester (FPCBM), [6,6]-phenyl-C71 butyric acid methyl ester ($PC_{70}BM$), indene-C60 bisadduct ($IC_{60}BA$), indene-C70 bisadduct ($IC_{70}BA$), fullerene-C60, fullerene-C70, carbon nanotubes (CNT), a carbon onion, and combinations thereof.

The dipole layer 118 is generally formed of a material that has dipoles and that has a high polarization charge density, such as at least about 5 $mC/m^2$. The dipole layer is sufficiently thin so as not to adversely affect the efficiency of photoinduced charge transfer between the donor layer 114 and the acceptor layer 116 but thick enough to be able to retain its polarization. For instance, the dipole layer may be, e.g., 1 nm thick, 0.6 nm thick, or the thickness of a monomolecular layer of the material of the dipole layer. The dipole layer may be, e.g., a ferroelectric block copolymer, a liquid crystal, or another material that has dipoles and that can retain its polarization.

Figure 2:
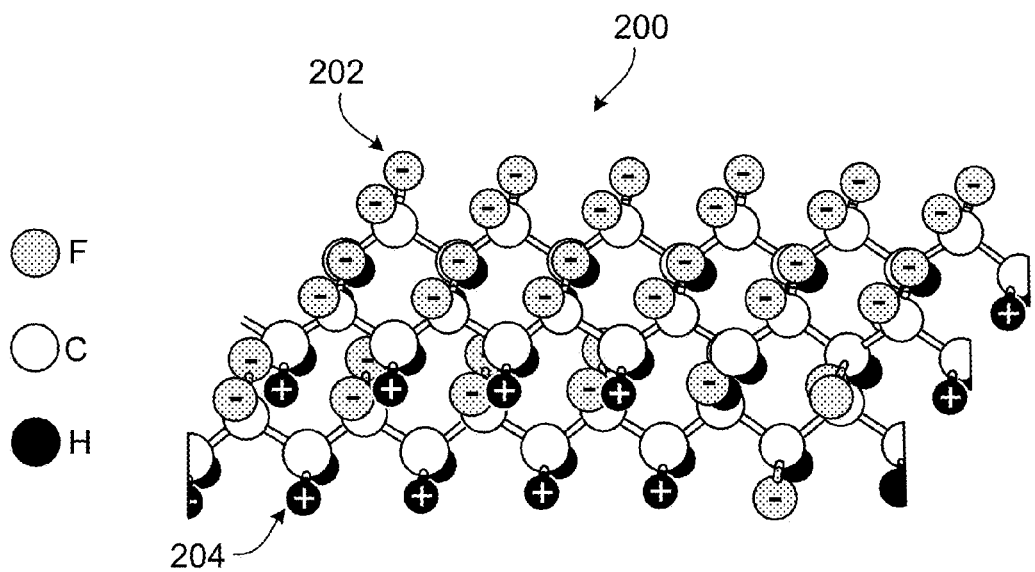
FIG. 2 is a schematic diagram of the molecular structure of a dipole layer.

In one example, the dipole layer 118 is formed of a ferroelectric polyvinylidene fluoride (70%)-tetrafluoroethylene (30%) copolymer (P(VDF-TrFE), referred to herein as PVT). The molecular structure 200 of PVT is shown in FIG. 2. The polarization charge density of PVT is about 100 mC/m$^2$, which arises from the large electron affinity difference between fluorine atoms 202 and hydrogen atoms 204 in the material. PVT is capable of retaining its ferroelectric polarization state even in films as thin as approximately 1 nm. In addition, PVT is chemically inert, can be fabricated at low temperatures, is photostable, and is compatible with polymer semiconductor materials, rendering it well suited for use in the photovoltaic device 100. Other materials having dipoles and high polarization charge density may also be used for the dipole layer 118. In the examples described herein, the dipole layer 118 is formed of PVT unless otherwise stated.

Referring again to FIG. 1, the photoactive layer 102 is disposed on a substrate 104. The substrate 104 includes a transparent support substrate 106, such as glass, and a transparent first electrode 108, such as indium tin oxide. In some examples, a transition layer 110 is formed between the substrate 104 and the photoactive layer 102. The transition layer 110 may be formed of, e.g., Poly(3,4-ethylenedioxythiophene):poly(styrenesulfonate) (PEDOT:PSS). A second electrode 112 formed of a metal, such as aluminum or silver, is disposed on the photoactive layer 102.

Figure 3:
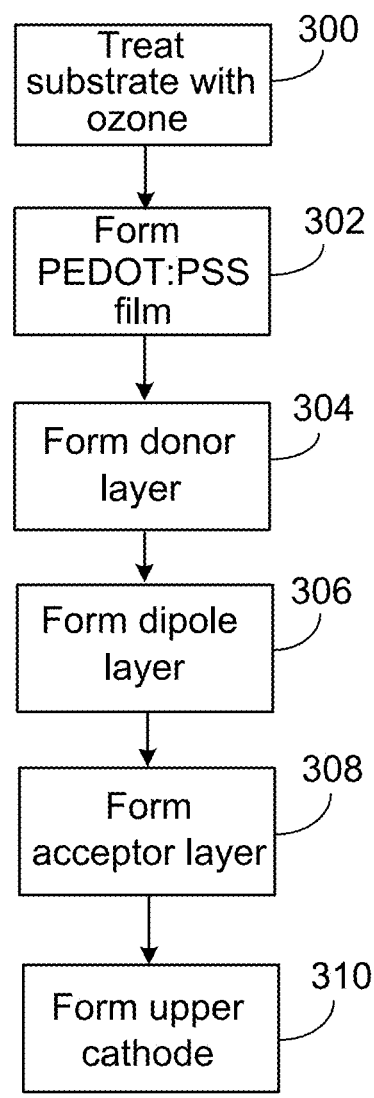
FIG. 3 is a flowchart of a process for making a photovoltaic device.

FIG. 3 is a flow diagram of an exemplary process for fabricating the photovoltaic device 100. A cleaned substrate of indium tin oxide on glass was treated by ultraviolet-ozone for ten minutes (300). Poly(3,4-ethylenedioxythiophene):poly)styrenesulfonate) (PEDOT:PSS) (Baytron-P 4083, H. C. Starck, Goslar, Germany) was spin coated onto the treated substrate at a spin speed of 3500 rpm (302). The resulting PEDOT:PSS film was approximately 30 nm thick, as measured with a Dektak profilometer. The PEDOT:PSS film was baked at 125° C. for 30 minutes.

A 20 mg/mL solution of P3HT (Rieke, Lincoln, Nebr., used as received) in 1,2-dichlorobenzene was spin coated onto the PEDOT:PSS film at a spin speed of 1000 rpm for 25 seconds followed by a spin speed of 2000 rpm for 35 seconds to form a donor layer of P3HT with a thickness of about 80 nm (304). A dipole layer of PVT (70:30) (Kunshan Hisense Electronics Co., Ltd, China) was coated onto the P3HT donor layer by Langmuir-Blodgett deposition and annealed at 135° C. for 30 minutes (306). A 5 mg/mL solution of PCBM in dichloromethane was spin coated onto the dipole layer and annealed at 140° C. for 20 minutes (308). An upper cathode was fabricated by thermally evaporating 10 nm of calcium covered by 100 nm of aluminum (310). The active device area was about 0.07 cm$^2$. The values of various parameters used in the fabrication process described above are merely examples. The parameters can have other values. Other thin film fabrication methods may also be used, such as printing, mist coating, or other deposition processes.

Figure 4:
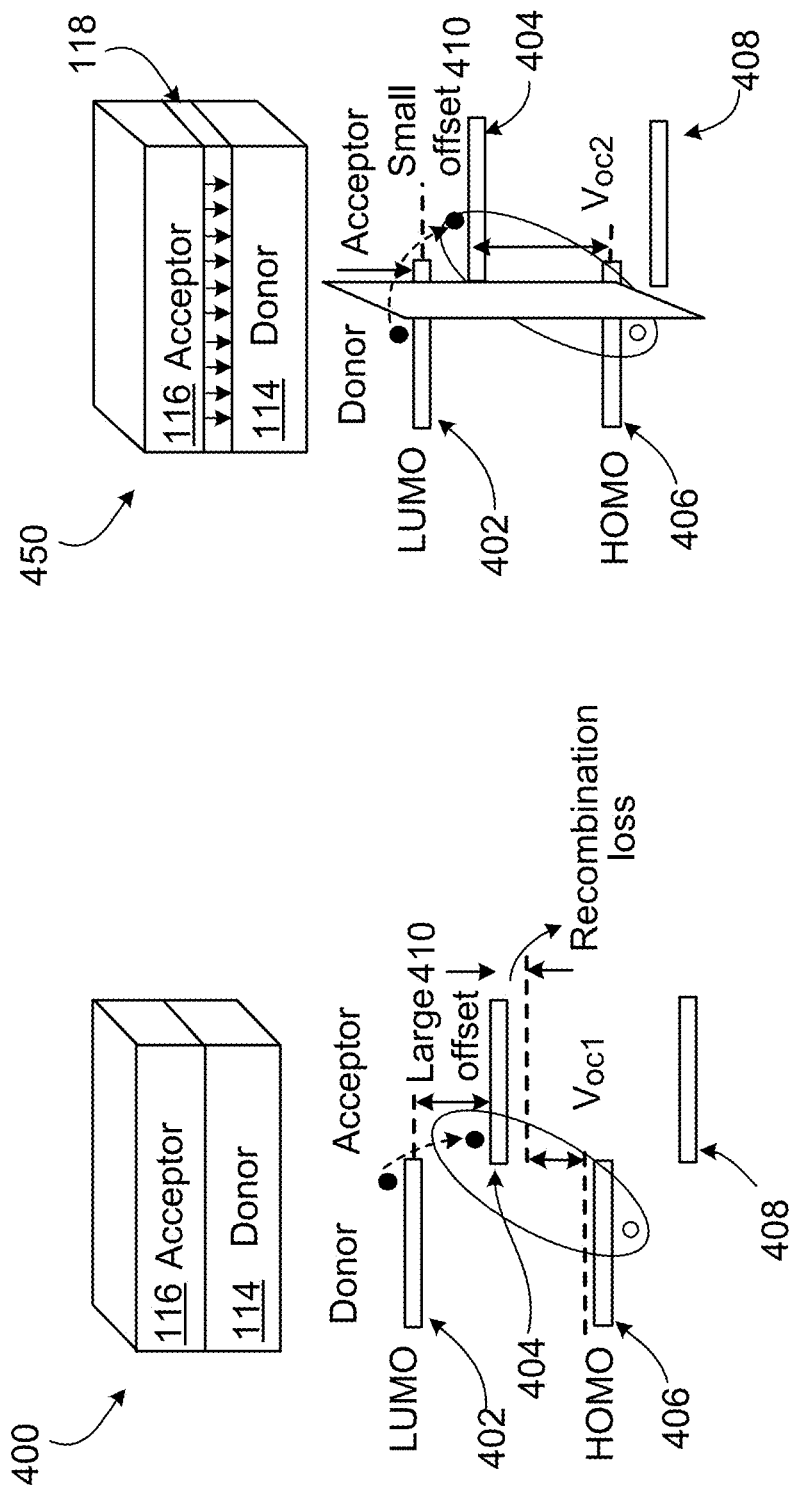
FIGS. 4A and 4B are energy level diagrams of a semiconductor heterostructure without and with a dipole layer, respectively.

Referring to FIG. 4A, in an organic semiconductor photovoltaic device having a donor layer 114 and an acceptor layer 116, the relative positions of the energy levels of the donor layer 114 and the acceptor layer 116 affect the efficiency of the photovoltaic device.

The donor layer 114 and the acceptor layer 116 each have a lowest unoccupied molecular orbital (LUMO) 402, 404, respectively, and a highest occupied molecular orbital (HOMO) 406, 408, respectively. The offset 410 between the LUMO 402 of the donor layer 114 and the LUMO 404 of the acceptor layer 116 is referred to as the "LUMO offset." Charge transfer efficiency between the donor layer 114 and the acceptor layer 116 is affected by the magnitude of the LUMO offset 410; charge transfer is generally more efficient between materials having a small LUMO offset 410.

In addition, the magnitude of the LUMO offset 410 is inversely related to the energy difference $E_{DA}$ between the HOMO 406 of the donor layer 114 and the LUMO 404 of the acceptor layer 116. The energy difference $E_{DA}$ in turn is substantially linearly correlated with the open circuit voltage $V_{oc}$ of the photovoltaic device. In general, a photovoltaic device having a large open circuit voltage $V_{oc}$ performs more efficiently than a photovoltaic device having a small open circuit voltage $V_{oc}$. Thus, an efficient photovoltaic device generally has a large open circuit voltage $V_{oc}$, a large energy difference $E_{DA}$, and a small LUMO offset 410.

In a structure 400 in which the donor layer 114 directly contacts the acceptor layer 116, the LUMO offset 410 is large, which results in a small energy difference $E_{DA}$ and a small open circuit voltage $V_{oc1}$.

Referring to FIG. 4B, without being bound by theory, it is believed that the presence of the dipole layer 118 between the donor layer 114 and the acceptor layer 116 causes a shift in the energy levels of the layers. In particular, it is believed that the dipole layer 118 reduces the LUMO offset 410, improving charge transfer efficiency between the donor layer 114 and the acceptor layer 116. In addition, the reduction in LUMO offset 410 causes an increase in the energy difference $E_{DA}$ and the open circuit voltage $V_{oc2}$ of the photovoltaic device, which suggests a higher efficiency the photovoltaic device.

In an organic photovoltaic device, efficient photoinduced charge transfer between the donor layer 114 and the acceptor layer 116 is relevant to the efficiency of the device. The presence of the dipole layer 118 is believed to improve the efficiency of such charge transfer (e.g., by reducing the LUMO offset 410 between the donor layer 114 and the acceptor layer 116). However, if the dipole layer 118 is too thick, the charge transfer efficiency across the dipole layer 118 may be adversely affected.

In some examples, the dipole layer 118 may be formed as thin as possible to achieve a desired energy level shift without adversely affecting charge transfer efficiency between the donor layer 114 and the acceptor layer 116. For instance, in one approach, the minimum dipole layer thickness (d) sufficient to achieve a desired energy level shift (E) can be estimated from the polarization charge density (σp) and the dielectric constant (∈d) of the material of the dipole layer 118 as follows:

$$d = \frac{\varepsilon_0 \varepsilon_d E}{\sigma_p q}$$

where $\varepsilon_0$ is the vacuum dielectric constant and q is the elemental electron charge.

For example, for a dipole layer formed of PVT, a thickness of only about 0.6 nm, which corresponds to about one monomolecular layer of PVT, is capable of inducing an energy level shift of about 0.8 eV. This energy level shift corresponds to a LUMO offset of about 0.2 eV, which may be sufficient to improve the efficiency of charge transfer between the donor layer 114 and the acceptor layer 116. A dipole layer 118 of such thickness is likely to have little or no adverse effect on the efficiency of charge transfer by tunneling between the donor layer 114 and the acceptor layer 116.

Figure 5:
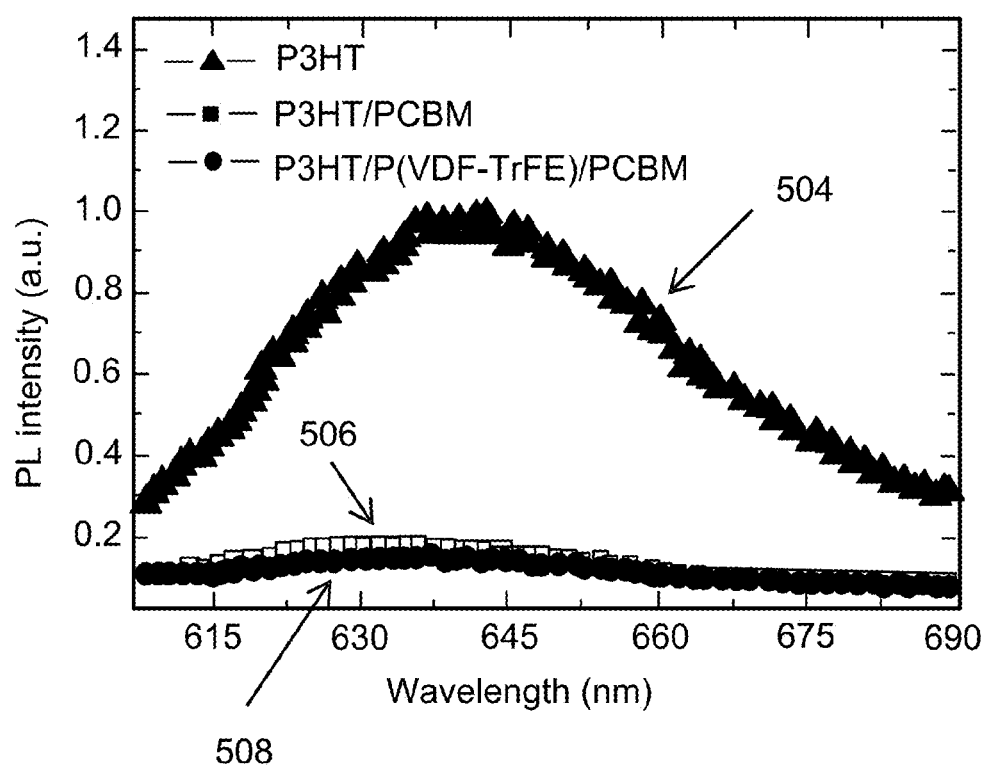
FIG. 5 is a plot of photoluminescence intensity.

Photoluminescence measurements can characterize the effect of a thin PVT dipole layer on the efficiency of photoinduced charge transfer between the donor layer 114 and the acceptor layer 116. Referring to FIG. 5, photoluminescence measurements were conducted on a single layer sample of donor material (P3HT), a bilayer sample including the donor layer 114 (P3HT) and the acceptor layer 116 (PCBM), and a trilayer sample including the donor layer 114 (P3HT), a monolayer (about 0.6 nm thick) of the dipole layer 118 (PVT), and the acceptor layer 116 (PCBM). Photoluminescence measurements were conducted using a commercial spectrophotometer (F-4500, Hitachi Inc.) equipped with a standard solid sample holder. The excitation light was provided by a Xenon lamp restricted to a spectral window of 480±2.5 nm. The photoluminescence emission from the sample was dispersed by a grating and the photoluminescence spectra were recorded at a speed of 60 nm/minute using a photomutiplier tube (R3788, Hamamatsu Photonics K.K., Bridgewater, N.J.) operated at 700 V.

The sample of donor material displayed a high photoluminescence intensity (curve 504) that peaked at about 1.0. In the bilayer sample, a dramatically lower photoluminescence intensity (curve 506) was observed, indicating the occurrence of charge transfer between the donor layer 114 and the acceptor layer 116. In the trilayer sample including the dipole layer 118, the photoluminescence intensity reduced further (curve 508). This result demonstrates that the presence of the dipole layer 118 does not hinder photoinduced charge transfer between the donor layer 114 and the acceptor layer 116 and may even improve the charge transfer efficiency. Without being bound by theory, it is believed that the dipole layer may improve charge transfer efficiency because the LUMO offset is larger than the molecular reorganization energy. The system thus enters the so-called "inverted" region of Marcus theory, resulting in an increased electron transfer rate.

Figure 6:
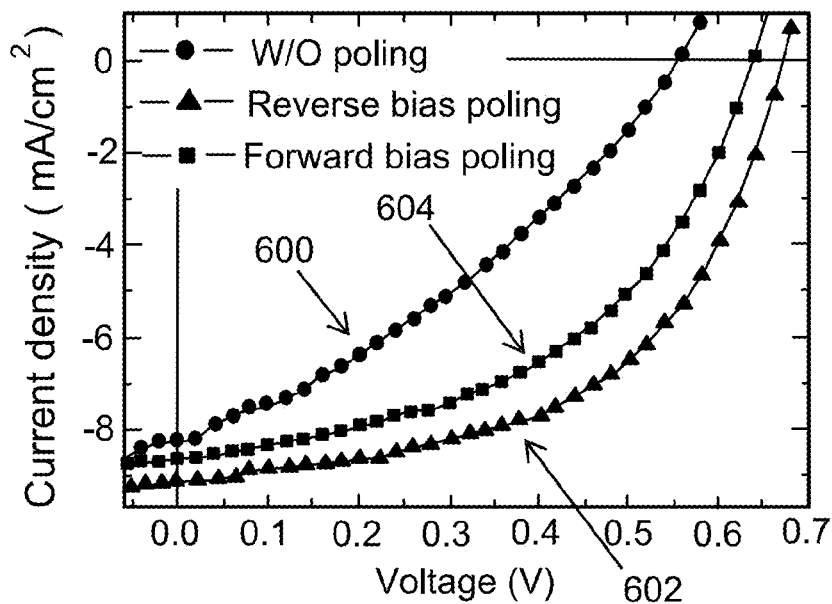
FIG. 6 is a plot of current density versus voltage.

Referring to FIG. 6, the current density was measured as a function of voltage for an as-fabricated (i.e., unpoled) P3HT-PCMB photovoltaic device including a PVT dipole layer (e.g., such as the device 100 shown in FIG. 1). The device exhibited a short circuit current density $J_{sc}$ of 8.2 mA/cm$^2$ and an open circuit voltage $V_{oc}$ of 0.55 V, as can be seen from curve 600. The fill factor and the power conversion efficiency of the unpoled device were determined to be 33% and 1.5%, respectively. These values are typical for a bilayer organic photovoltaic device with a P3HT donor layer and a PCBM acceptor layer. Photocurrent was measured under simulated air mass 1.5 global irradiation (100 mW/cm$^2$).

Upon application of a reverse bias voltage to the photovoltaic device, the dipoles in the dipole layer partially or completely align along the direction of the applied field. A reverse bias voltage can be applied to the photovoltaic device by, for example, connecting the electrodes 108 and 112 to a voltage difference such that the voltage applied to the electrode 108 is lower than the voltage applied to the electrode 112. Because of the ferroelectric nature of the dipole layer, the dipoles remained aligned even after removal of the bias voltage. The application and removal of a bias voltage to a photovoltaic device is referred to herein as "poling" the device. Referring still to FIG. 6, after reverse poling the photovoltaic device with a large reverse bias voltage (e.g., −16 V), the photovoltaic device exhibited a higher short circuit current density $J_{sc}$ of about 9.0 mA/cm$^2$ and a higher open circuit voltage $V_{oc}$ of 0.67 V, as can be seen from curve 602. The fill factor of the reverse poled device was increased to 55% and the power conversion efficiency more than doubled to 3.3% as compared with the unpoled device. It is thus apparent that the performance of an organic photovoltaic device can be improved by the presence of a poled dipole layer between the donor layer and the acceptor layer.

The polarization state of the dipole layer is bistable and can be switched between opposite states by application of a voltage pulse of the appropriate polarity. This state switching enables the performance of a photovoltaic device including a dipole layer to be tuned. Referring still to FIG. 6, after forward poling the photovoltaic device with a small forward bias voltage (e.g., +2V), the dipoles in the dipole layer align in the opposite direction (compared to the situation where a reverse bias voltage is applied). A forward bias voltage can be applied to the photovoltaic device by, for example, connecting the electrodes 108 and 112 to a voltage difference such that the voltage applied to the electrode 108 is higher than the voltage applied to the electrode 112. The forward poled device still exhibited an improvement in performance (as can be seen from curve 604) as compared to the unpoled device, but the improvement was less significant than the improvement resulting from reverse poling. The +2 V forward bias applied in this example is relatively small so as to avoid generating a high current density that could potentially burn the device. Thus, it is possible that the less pronounced improvement in performance may be due to only partial alignment of the dipoles in the dipole layer.

Figure 7:
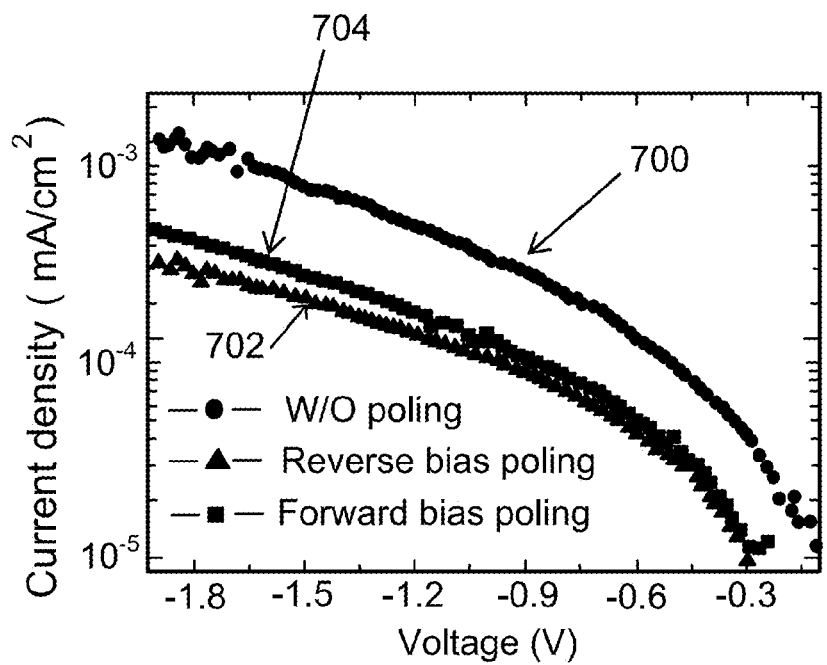
FIG. 7 is a plot of dark current of a photovoltaic device.

Referring to FIG. 7, the dark current of the photovoltaic device can also be tuned by poling the device. The dark current of an unpoled device including a dipole layer is shown in curve 700. After reverse poling (−16 V), the dark current is reduced by a factor of four, as can be seen from curve 702. Forward poling (+2 V) causes a lesser reduction in the dark current of the device, as can be seen from curve 704.

Without being bound by theory, it is believed that the reduction in dark current is due to the tuning of the energy levels of the donor and acceptor layers that results from the alignment of dipoles in the dipole layer. In a bilayer organic photovoltaic device (i.e., a device including a donor layer and an acceptor layer but not a dipole layer), the dark current originates from thermal activation of electrons from the HOMO of the donor layer to the LUMO of the acceptor layer. The activation energy of this process is $E_{DA}$, as can be seen from the general expression for the open circuit voltage $V_{oc}$ in an organic photovoltaic device:

$$V_{oc} = \frac{nkT}{q}\ln\left(\frac{J_{sc}}{J_0}+1\right) \approx \frac{nkT}{q}\ln\left(\frac{J_{sc}}{J_0}\right)$$

$$J_0 = J_{00}\exp\left(\frac{-E_{DA}}{nkT}\right),$$

where k is the Boltzmann constant, T is temperature, q is the elemental electron charge, $J_0$ is the saturated dark current density, $J_{00}$ is a factor for the recombination of charge transfer excitons (e.g., bound electron-hole pairs), and n is the diode ideality factor.

As discussed above (e.g., as shown in FIGS. 4A and 4B), when a poled dipole layer is present between the donor layer and the acceptor layer of a photovoltaic device, the LUMO of the acceptor layer is shifted upwards, causing $E_{DA}$ to increase. According to the above equations, the increase in $E_{DA}$ reduces the saturated dark current density $J_0$, thus increasing the open circuit voltage $V_{oc}$ and resulting in improved device performance. The presence of the dipole layer may also reduce the electronic coupling between the donor layer and the acceptor layer by increasing the spacing between the layers, hence reducing the recombination of charge transfer excitons. This reduction in recombination is reflected by a reduction in $J_{00}$, which results in a further increase in the open circuit voltage $V_{oc}$ and further improved device performance.

Piezoresponse force microscopy measurements were conducted to characterize the morphology and ferroelectric state of the dipole layer. Piezoresponse force microscopy is able to measure the local piezoelectric response on the surface of a material as well as in underlying layers of material. For instance, piezoresponse force microscopy can measure the piezoelectric response of the dipole layer embedded under the acceptor layer and a thin layer of metal. The piezoelectric response of a material is related to the net electric polarization of the material; thus, piezoresponse force microscopy can be used to probe the local polarization state of the material. In the examples below, a piezoresponse force microscope model MFP-3D manufactured by Asylum Research (Goleta, Calif.) was used.

Figure 8A:
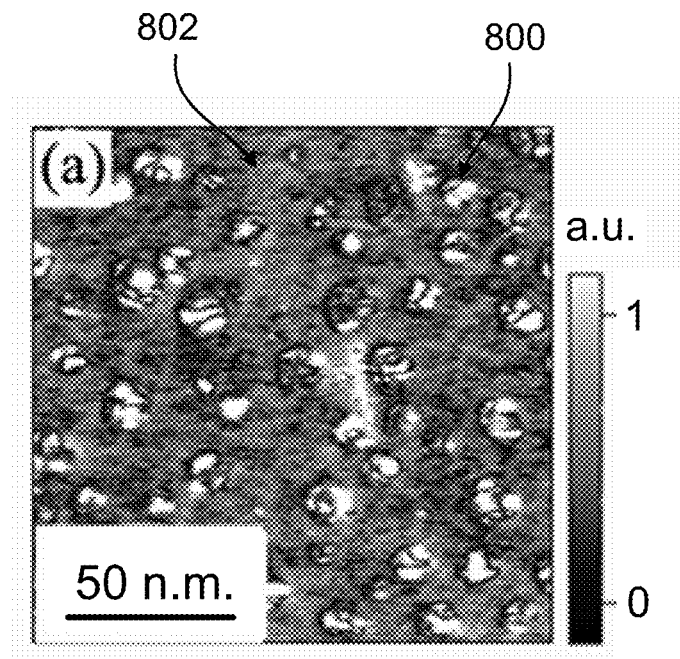
FIGS. 8A and 8B are piezoresponse force microscopy amplitude and phase images, respectively. The image size is 1 μm×1 μm.
Figure 8B:
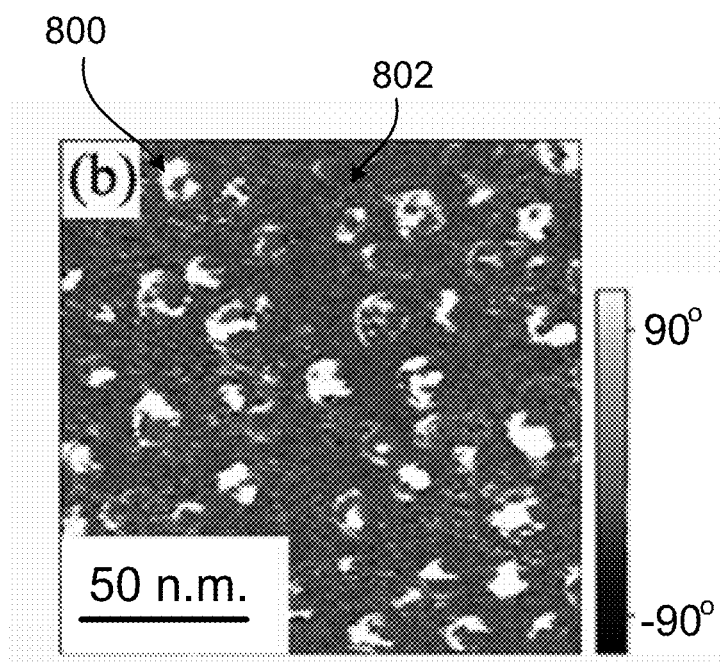

FIGS. 8A and 8B are piezoresponse force microscopy amplitude and phase images, respectively, of nanoislands 800 of a dipole layer material (PVT) on the surface 802 of a donor layer (P3HT). The ferroelectric state of the nanoislands 800, as indicated by the light color of the nanoislands in the images, suggests that the nanoislands are capable of maintaining permanent polarization. The nanoislands 800 cover approximately 20% of the surface 802 of the donor layer. Without being bound by theory, it is believed that PVT on a P3HT surface shrinks upon thermal annealing, resulting in incomplete surface coverage and the formation of the observed nanoislands 800.

The open circuit voltage $V_{oc}$ of 0.67 V observed in the poled photovoltaic device including a dipole layer is less than the maximum open circuit voltage of 1.5 V that is theoretically attainable from a photovoltaic device including a dipole layer. This difference may be due to the morphology of the dipole layer and the presence of the nanoislands 800. The incomplete surface coverage of the dipole layer on the donor layer surface causes direct contact between the donor layer and the acceptor layer. In such a structure, the observed open circuit voltage can be considered to be the average open circuit voltage of many nanoscale organic photovoltaic devices connected in parallel, some of which include a dipole layer (i.e., at the locations of the nanoislands 800) and others of which do not include a dipole layer (i.e., where the donor layer directly contacts the acceptor layer). By increasing the surface coverage and uniformity of the dipole layer on the donor layer, the open circuit voltage may be further increased as the amount of contact between the donor layer and the acceptor layer is reduced.

Figure 9A:
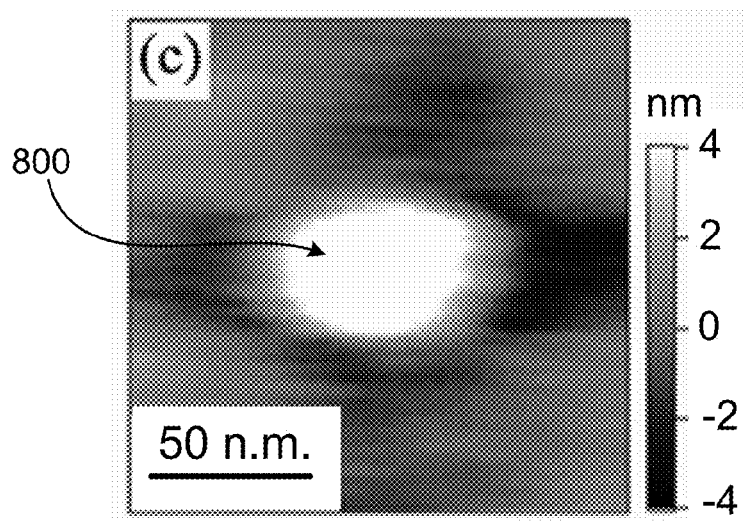
FIG. 9A is a piezoresponse force microscopy topography image of a nanoisland.
Figure 9B:
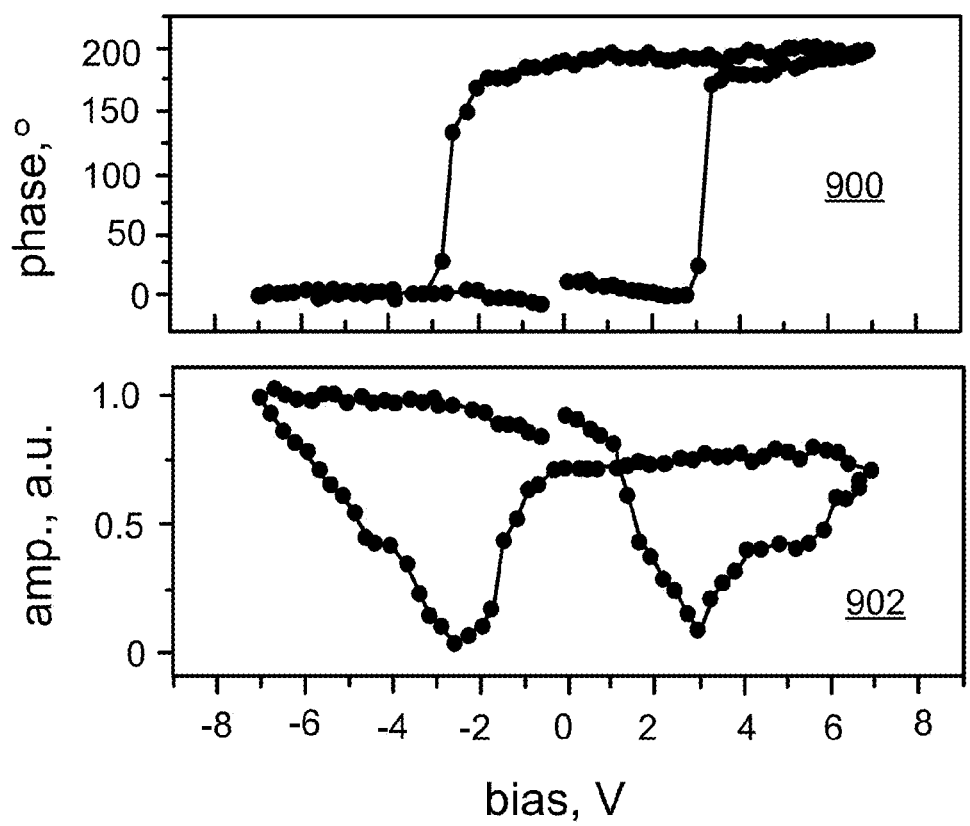
FIG. 9B is a plot of piezoresponse force microscopy phase and amplitude hysteresis loops.
Figure 9C:
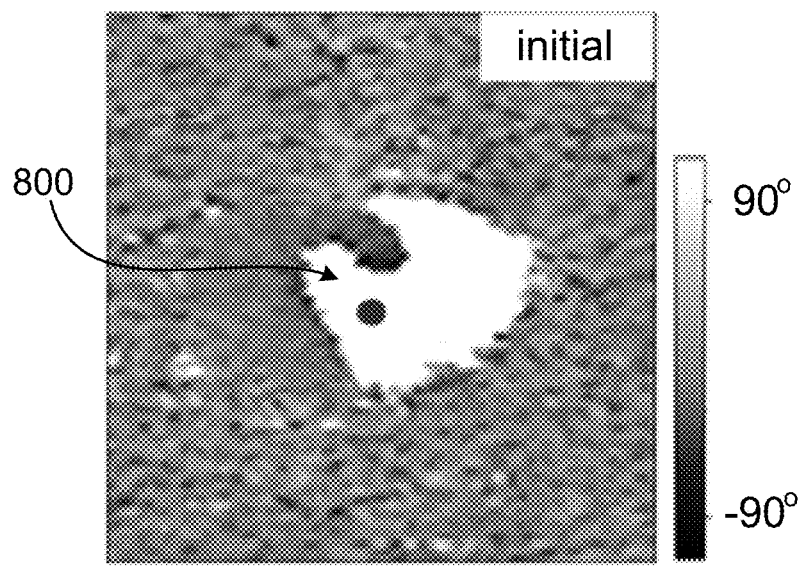
FIGS. 9C and 9D are piezoresponse force microscopy phase images of a nanoisland before and after application of a reverse bias, respectively.
Figure 9D:
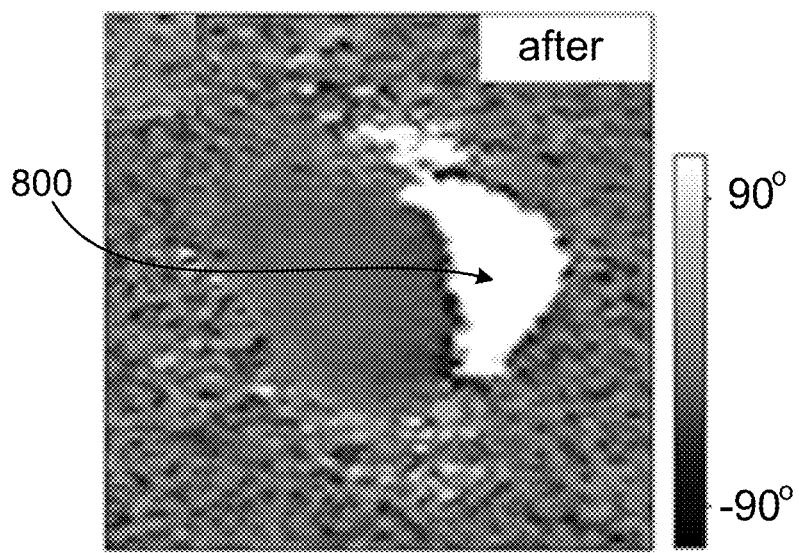

The ferroelectric state of the nanoislands 800 was further probed by applying a pulse voltage between the piezoresponse force microscopy tip and one nanoisland 800 to obtain a direct observation of the polarization of the nanoisland. A topographic piezoresponse force microscopy image of an example nanoisland 800 is shown in FIG. 9A. Forward and reverse biases were applied to the nanoisland 800 to polarize the dipoles in the nanoisland. Referring to FIG. 9B, phase 900 and amplitude 902 hysteresis measurements were collected during application of the biases. The hysteresis loops reveal that a reverse coercive bias of −2.6 V or a forward coercive bias of +3 V is sufficient to substantially completely polarize the dipoles in the nanoisland 800. Upon application of a reverse bias of −6 V, the polarization direction of the nanoisland 800 can be reversed, as can be seen from the piezoresponse force microscopy phase images shown in FIG. 9C (before poling) and FIG. 9D (after poling).

Electrostatic force microscopy (EFM) was used to confirm the tuning of the relative energy levels between the donor layer and the acceptor layer by the presence of the poled dipole layer. The substrate (e.g., indium tin oxide) of a photovoltaic device including a dipole layer was grounded and a region of the device was poled by scanning a platinum tip across the region in contact mode to apply a forward bias of +4 V between the tip and the substrate in the scanned region. After poling the device, a potential image of the substrate was measured in non-contact (e.g., tapping) mode with a small bias of +0.2 V on the platinum tip. In the examples below, electrostatic force microscopy was conducted using an EnviroScope Atomic Force Microscope (ESCOPE) manufactured by Veeco, Digital Instruments (Lowell, Mass.).

Figure 10A:
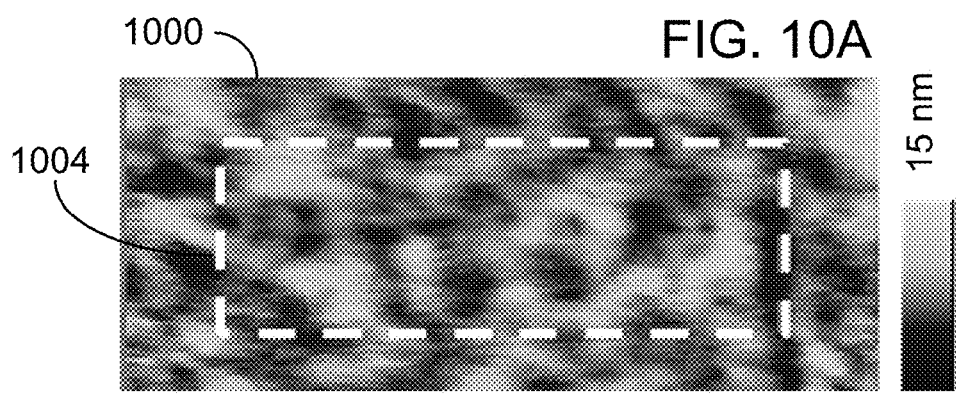
FIGS. 10A and 10B are PFM topography and surface potential images, respectively.
Figure 10B:
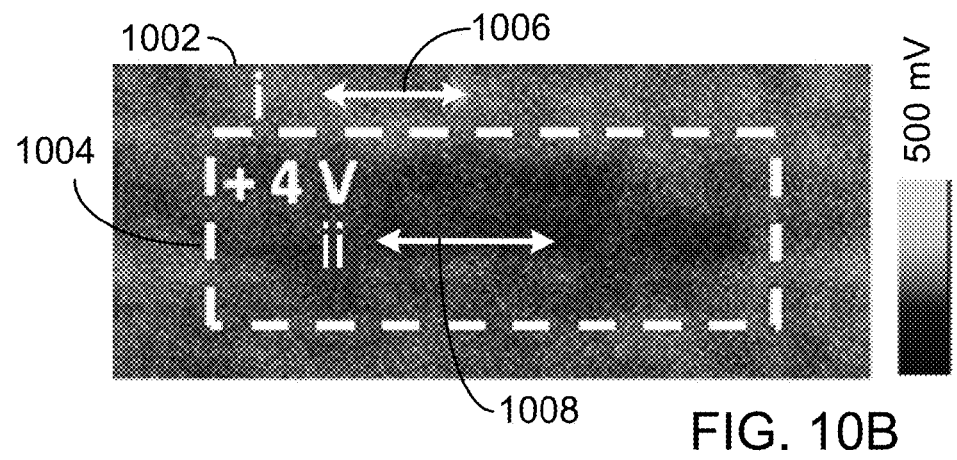
Figure 10C:
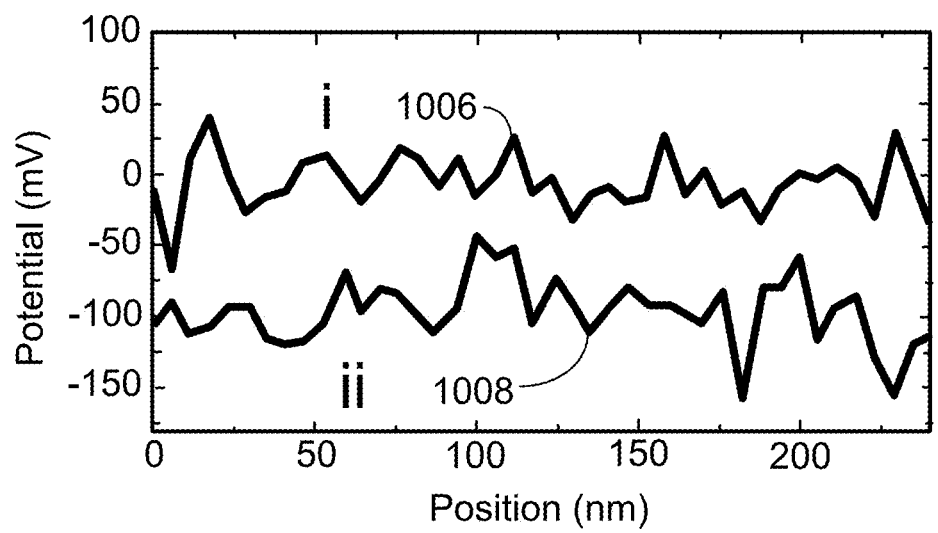
FIG. 10C is a cross-sectional profile of the surface potential image of FIG. 10B.

FIGS. 10A and 10B show topography 1000 and surface potential 1002 electrostatic force microscopy images, respectively, of the photovoltaic device after forward poling. The region inside the dashed rectangle 1004 indicates the region that was poled by the forward bias of +4 V. The topography of the device (FIG. 10A) was not changed by the poling of the dipole layer. The electrical potential (FIG. 10B) in the poled region dropped by 100 mV and can be seen by the darker color inside the dashed rectangle 1004. Referring to FIG. 10C, this electrical potential difference can also be observed by viewing a cross sectional analysis of the electrical potential image of FIG. 10B along a line 1006 within the unpoled region and along a line 1008 within the poled region of the device.

Figure 11:
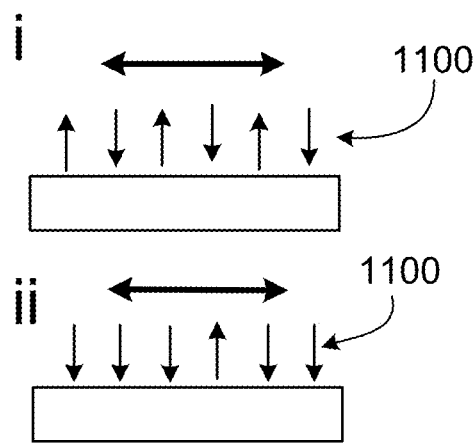
FIG. 11 is a diagram of a proposed mechanism for the origin of the potential difference shown in FIG. 10C.

The average surface potential difference of 0.1 V between poled and unpoled regions of the device is consistent with the change in the open circuit voltage of the photovoltaic device measured above. The fluctuation of the surface potential (peak to valley potential difference of at least about 0.3 V) is consistent with the nonuniform distribution of the dipole layer on the donor layer surface (e.g., the presence of nanoislands). Referring to FIG. 11, without being bound by theory, it is believed that the difference in surface potential between poled and unpoled regions of the device may be due to the alignment of the electrical dipoles in the poled region. In the unpoled region (top), dipoles 1100 in the dipole layer are not aligned. In the poled region (bottom), the dipoles 1100 are substantially aligned according to the direction of the applied bias, resulting in the generation of a surface electric field.

The surface electric field generated by the aligned dipoles in the dipole layer causes a shift in the energy levels of the donor layer and the acceptor layer in a photovoltaic device, resulting in an increase in the open circuit voltage $V_{oc}$ and an improved power conversion efficiency of the device.

Although the examples described above characterized a photovoltaic device formed with P3HT:PCMB and with a dipole layer of PVT, other materials are also possible. For instance, other organic semiconductors may be used for the donor layer, the acceptor layer, or both, in order to achieve a desired performance. Other materials may also be used for the dipole layer, such as materials that include polarizable dipoles that are capable of maintaining polarization after removal of a polarizing external electric field.

Figure 12:
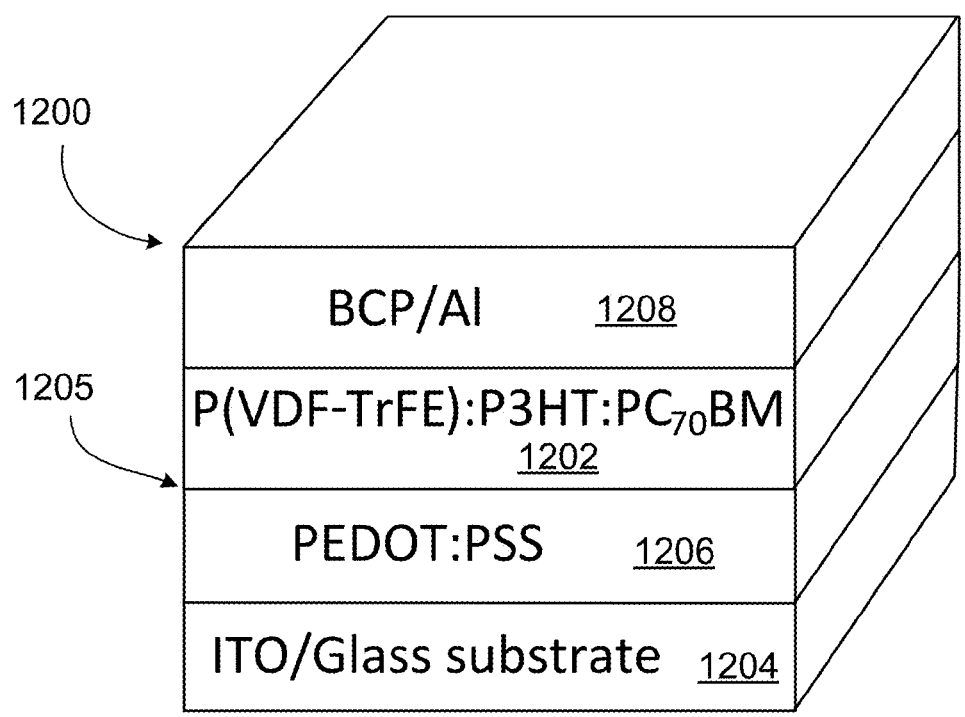
FIG. 12 is a diagram of a photovoltaic device.

Referring to FIG. 12, in another embodiment, an organic Schottky junction photovoltaic device 1200 includes a single active layer 1202 disposed on a transparent, conductive substrate 1204, such as indium tin oxide on glass. In some examples, an anode layer 1206 is present between the substrate 1204 and the active layer 1202 to form a Schottky junction 1205. A cathode layer 1208 is formed over the active layer 1202 to form an Ohmic contact.

The anode layer 1206 may be made of any appropriate material or combination of materials that, in conjunction with the active layer 1202, is capable of forming a Schottky junction. For example, the anode layer 1206 may be formed of one or more of the following materials: indium-tin oxide (ITO), indium-zinc oxide, silver, gold, platinum, copper, chromium, indium oxide, zinc oxide, tin oxide, a polyaniline (PANI)-based conducting polymer, a 3,4-polyethylenedioxythiopene-polystyrenesultonate (PEDOT)-based conducting polymer such as PEDOT:PSS, carbon nanotubes (CNT), graphite, graphene, molybdenum oxide (MoOx), tungsten oxide, vanadium oxide, silver oxide, aluminum oxide, or combinations thereof.

The top cathode layer 1208 may be made of any appropriate material or combination of materials that, in conjunction with acceptor material in the active layer 1202, results in ohmic contact at the interface between the active layer and cathode. For example, the cathode may be formed of one or more of the following materials: an alkali metal (e.g., lithium, sodium, potassium, or cesium), an alkaline earth metal (e.g., magnesium, calcium, strontium, or barium), a transition metal (e.g., chromium, iron, cobalt, nickel, copper, silver, gold, or zinc), a lanthanoid (e.g., samarium or ytterbium), tin, aluminum, a transition metal oxide (e.g., zinc oxide or titanium oxide), an alkali metal fluoride (e.g., lithium fluoride), an alkaline earth metal fluoride, an alkali metal chloride, an alkaline earth metal chloride, an alkali metal oxide, an alkaline earth metal oxide, a metal carbonate, a metal acetate, graphene, bathocuproine (BCP), phenanthroline and derivatives thereof (e.g., bathophenanthroline (BPhen)), or combinations thereof.

Figures 13A, 13B:
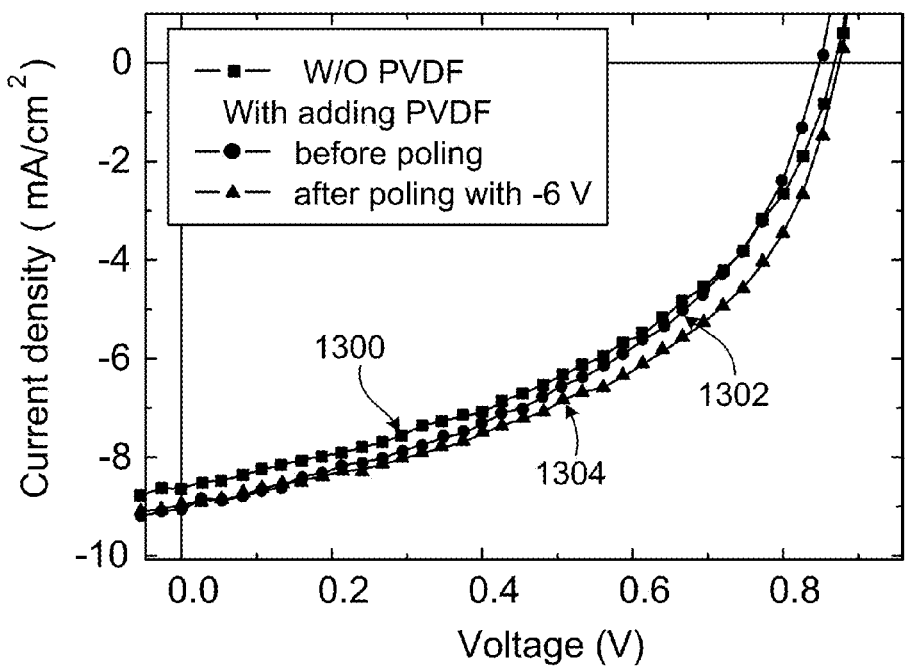
FIG. 13A is a plot of current density versus voltage for the photovoltaic device of FIG. 12.
FIG. 13B is a table of performance parameters.

In some examples, the active layer 1202 is formed of a fullerene-based acceptor material, such as [6,6]-phenyl-C71 butyric acid methyl ester (PC70BM), with a small percentage (e.g., 5% by weight) of a donor material, such as P3HT. Referring to FIGS. 13A and 13B, a photovoltaic device 1200 formed with such an active layer exhibited a short circuit current density $J_{sc}$ of 8.65 mA/cm$^2$ and an open circuit voltage $V_{oc}$ of 0.868 V, as can be seen from curve 1300. The fill factor of the device was 44% and the power conversion efficiency was 3.3% under an illumination of 100 mW/cm$^2$. The open circuit voltage of this device 1200 is larger than the open circuit voltage for a typical bulk heterojunction device formed with an active layer including only an acceptor material. However, the fill factor for this device is relatively low, which may be due to the charge recombination that occurs in fullerene-based films.

In some examples, a dipole material, such as PVT (e.g., 10% by weight) is also added to the active layer 1202, forming an active layer that contains acceptor material, donor material, and dipole material.

Before poling, a photovoltaic device 1200 formed with an active layer including a dipole material exhibited a short circuit current density $J_{sc}$ and an open circuit voltage $V_{oc}$ of 9.08 mA/cm$^2$ and 0.850 V, respectively, as can be seen from curve 1302. The fill factor and power conversion efficiency were enhanced to 45% and 3.5%, respectively, as compared to the device without dipole material. This performance enhancement may be explained by the increase in the dielectric constant of the active layer 1202 caused by the addition of the dipole material, which in turn leads to a reduction in the Coulombic attraction of charge transfer excitons generated in the active layer 1202.

After poling by applying a reverse bias of −6 V to the photovoltaic device 1200 formed with an active layer 1202 including a dipole material, the device efficiency was increased by 12%. Specifically, the device exhibited a short circuit current density $J_{sc}$ and an open circuit voltage $V_{oc}$ of 8.92 mA/cm$^2$ and 0.875 V, respectively, as can be seen from curve 1304. The fill factor and power conversion efficiency were 47% and 3.7%, respectively. This performance enhancement may be explained by the alignment of dipoles in the dipole material, which generates a barrier that impedes the recombination of charge transfer excitons in the active layer 1202.

The foregoing description is intended to illustrate and not to limit the scope of the invention, which is defined by the scope of the appended claims. Other embodiments are within the scope of the following claims.

What is claimed is:

1. An apparatus comprising:
    a substrate; and
    a photoactive layer disposed on the substrate, the photoactive layer comprising:
        an electron acceptor material;
        an electron donor material; and
        a material having dipoles, the material having dipoles comprising one or more of a ferroelectric polymer or liquid crystal molecules,
        in which a first surface of the material having dipoles is in physical contact with the electron acceptor material and a second surface of the material having dipoles is in physical contact with the electron donor material, the first surface opposite the second surface.

2. The apparatus of claim 1, wherein the electron acceptor material includes fullerenes.

3. The apparatus of claim 1, wherein the dipoles align upon application of a bias electric field.

4. The apparatus of claim 1, wherein the material having dipoles has a polarization charge density of at least about 5 mC/m$^2$.

5. The apparatus of claim 1, wherein the material having dipoles is configured to cause a shift in an energy level of at least one of the electron acceptor material and the electron donor material.

6. The apparatus of claim 5, wherein the dipoles reduce an offset between the lowest unoccupied molecular orbitals of the electron acceptor material and the electron donor material.

7. The apparatus of claim 1, wherein the material having dipoles includes polyvinylidene fluoride and tetrafluoroethylene.

8. The apparatus of claim 1, wherein the material having dipoles comprises liquid crystal molecules.

9. The apparatus of claim 1, wherein the substrate includes a layer of a conductive material disposed on a support substrate.

10. An apparatus comprising:
    an electrically conductive substrate;
    a photoactive layer disposed on the substrate, the photoactive layer comprising:
        an electron acceptor material;
        an electron donor material; and
        a material having dipoles, the material having dipoles comprising one or more of a ferroelectric polymer or liquid crystal molecules,
        in which the material having dipoles is between the electron acceptor material and the electron donor material; and
    an electrical contact disposed on the photoactive layer.

11. The apparatus of claim 10, wherein the material having dipoles is configured to increase an open circuit voltage between the substrate and the electrical contact.

12. The apparatus of claim 10, wherein the material having dipoles is configured to cause a shift in an energy level of at least one of the electron acceptor material and the electron donor material.

13. The apparatus of claim 10, wherein the dipoles align upon application of a bias to the material having dipoles.

14. The apparatus of claim 10, wherein the substrate is transparent.

15. The apparatus of claim 10, wherein at least one of the electron acceptor material and the electron donor material comprises an organic semiconductor material.

16. The apparatus of claim 12, wherein the dipoles reduce an offset between the lowest unoccupied molecular orbitals of the electron acceptor material and the electron donor material.

17. The apparatus of claim 10, wherein the material having dipoles has a polarization charge density of at least about 5 mC/m$^2$.

18. The apparatus of claim 10, wherein the material having dipoles includes polyvinylidene fluoride and tetrafluoroethylene.

19. A method comprising:
forming a photoactive layer on an electrically conductive substrate, the photoactive layer comprising:
an electron acceptor material;
an electron donor material; and
a material having dipoles, the material having dipoles comprising one or more of a ferroelectric polymer or liquid crystal molecules,
in which the material having dipoles is between the electron acceptor material and the electron donor;
forming an electrical contact on the photoactive layer; and
applying an electrical bias to the material having dipoles.

20. The method of claim 19, wherein applying an electrical bias to the material having dipoles includes causing dipoles to align.

21. The method of claim 19, wherein applying an electrical bias to the material having dipoles includes causing an increase in an open circuit voltage between the substrate and the electrical contact.

22. The method of claim 19, wherein at least one of the electron acceptor material and the electron donor material is an organic semiconductor material.

23. The method of claim 19, wherein the material having dipoles is configured to cause a shift in an energy level of at least one of the electron acceptor material and the electron donor material.

24. The method of claim 23, wherein the dipoles reduce an offset between the lowest unoccupied molecular orbitals of the electron acceptor material and the electron donor material.

25. The method of claim 19, wherein the substrate is transparent.

26. The method of claim 19, wherein the material having dipoles has a polarization charge density of at least about 5 mC/m$^2$.

27. The method of claim 19, wherein the material having dipoles includes polyvinylidene fluoride and tetrafluoroethylene.

28. An apparatus comprising:
a substrate; and
a photoactive layer disposed on the substrate, the photoactive layer comprising:
an electron acceptor material;
an electron donor material; and
a material having dipoles, the material having dipoles comprising one or more of a ferroelectric polymer or liquid crystal molecules, in which the material having dipoles is between the electron acceptor material and the electron donor material.

29. The apparatus of claim 28, wherein the dipoles align upon application of a bias to the photoactive layer.

30. The apparatus of claim 28, wherein at least one of the electron acceptor material and the electron donor material is an organic semiconductor material.

31. The apparatus of claim 28, wherein the substrate is transparent.

32. The apparatus of claim 28, wherein the material having dipoles has a polarization charge density of at least about 5 mC/m$^2$.

33. The apparatus of claim 28, wherein the material having dipoles is configured to cause a shift in an energy level of at least one of the electron acceptor material and the electron donor material.

34. The apparatus of claim 33, wherein the dipoles reduce an offset between the lowest unoccupied molecular orbitals of the electron acceptor material and the electron donor material.

35. The apparatus of claim 28, wherein the material having dipoles includes polyvinylidene fluoride and tetrafluoroethylene.

* * * * *